United States Patent [19]
Tanaka

[11] Patent Number: 6,011,720
[45] Date of Patent: Jan. 4, 2000

[54] NONVOLATILE MEMORY WITH REDUCED WRITE TIME/WRITE VERIFY TIME AND SEMICONDUCTOR DEVICE THEREOF

[75] Inventor: Nobuhiko Tanaka, Tokyo, Japan

[73] Assignee: Mitsubishi Denki Kabushiki Kaisha, Osaka, Japan

[21] Appl. No.: 09/089,765

[22] Filed: Jun. 3, 1998

[30] Foreign Application Priority Data

Jan. 13, 1998 [JP] Japan .................................. 10-005190

[51] Int. Cl.[7] .................................................. G11C 16/06
[52] U.S. Cl. ............................... 365/185.22; 365/185.23; 365/185.11; 365/185.12; 365/185.13
[58] Field of Search .......................... 365/185.22, 185.11, 365/185.12, 185.13, 185.23

[56] References Cited

U.S. PATENT DOCUMENTS

5,561,631 10/1996 Curd ..................................... 365/185.22
5,898,618 4/1999 Lakkapragada et al. .......... 365/185.22

Primary Examiner—Andrew Q. Tran
Attorney, Agent, or Firm—Burns, Doane, Swecker & Mathis, LLP

[57] ABSTRACT

An involatile memory which carries out, in a flash memory itself, verify check of the flash memory for respective bit lines, and produces an overall verify check result from a completion decision circuit to a tester. This makes it possible to solve a problem of a conventional flash memory in that the time taken by the verify check depends on the bus width of an external data bus, because it carries out the verify check by reading data from the flash memory through the external bus. Thus, the time taken by the verify check can be reduced.

6 Claims, 7 Drawing Sheets

NONVOLATILE MEMORY WITH REDUCED WRITE TIME/WRITE VERIFY TIME AND SEMICONDUCTOR DEVICE THEREOF

BACKGROUND OF THE INVENTION

1. Field of the Invention

The present invention relates to a nonvolatile memory such as a flash memory including memory transistors each having a floating gate, and more particularly to an improvement in the memory to reduce the time needed for writing data into the memory transistors.

2. Description of Related Art

Figure 7:
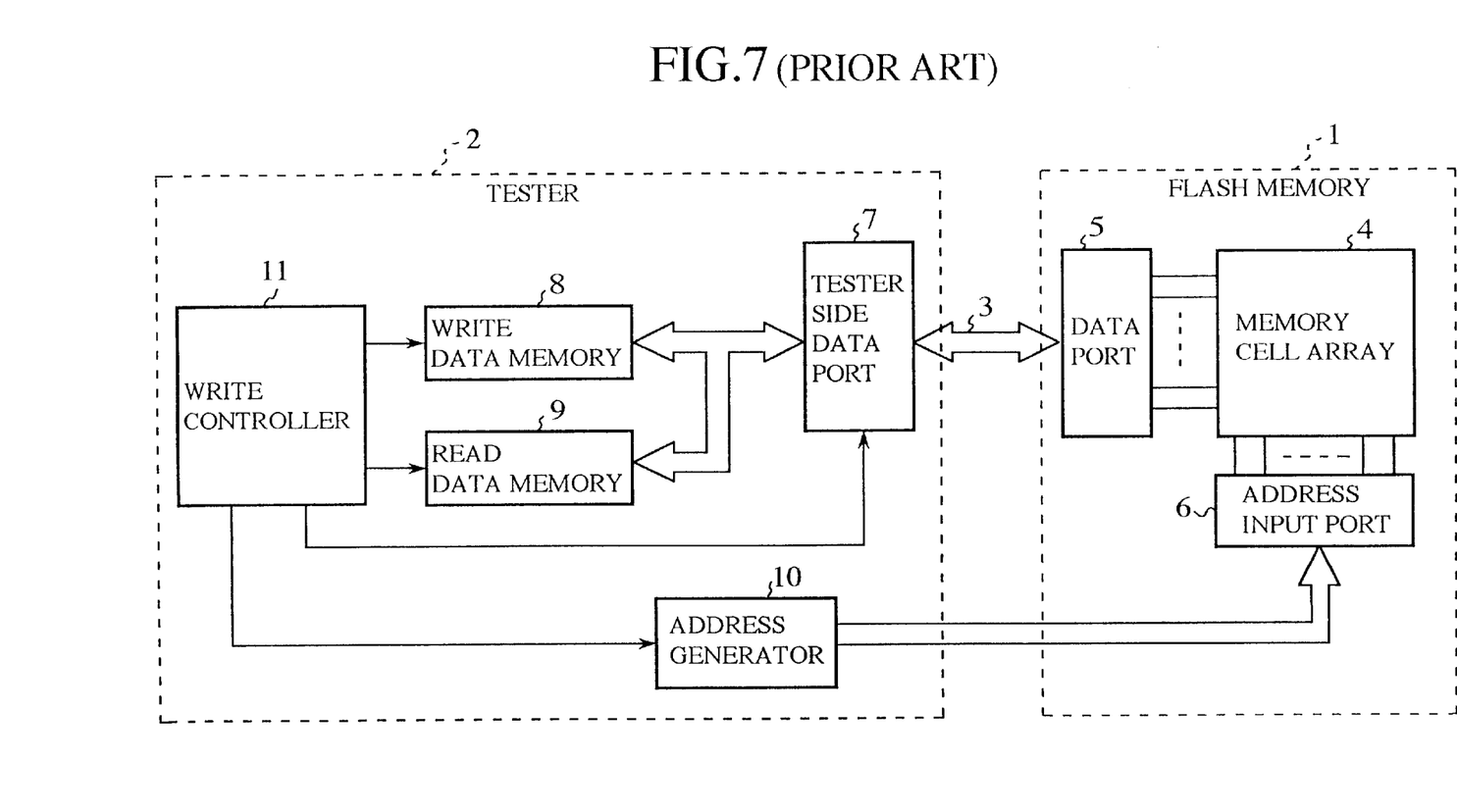
FIG. 7 is a block diagram showing a conventional flash memory in connection with a configuration for writing data to it.

FIG. 7 is a block diagram showing a conventional flash memory and a configuration for writing data into it. In FIG. 7, the reference numeral 1 designates a flash memory; 2 designates a tester for writing data into the flash memory 1; and 3 designates an external data bus for interconnecting them. The reference numeral 4 designates a memory cell array including a plurality of memory transistors; 5 designates a data port for interconnecting the memory cell array 4 with the external data bus 3; and 6 designates an address input port for selecting from the memory cell array 4 memory transistors to be connected to the data port 5. The reference numeral 7 designates a tester side data port connected to the external data bus 3; 8 designates a write data memory for storing write data to be output from the tester side data port 7; 9 designates a read data memory 9 for storing write verify data supplied from the tester side data port 7; 10 designates an address generator for selecting a data write/read address; and 11 designates a write controller for controlling the blocks 7, 8, 9 and 10, thereby having the memory cell array 4 store the data in the write data memory 8.

Next, the operation of the conventional system will be described.

When data to be written is stored in the write data memory 8 of the tester 2, the write controller 11 starts to write the data. Specifically, it carries out control such that the address generator 10 generates a write start address, and the tester side data port 7 sets the data to be written in the address. Thus, the flash memory 1 sequentially selects the memory transistors corresponding to the address, and performs charge injection to the floating gates of the memory transistors in accordance with the input data.

When completing the data write, the write controller 11 has the address generator 10 generate that address again to which the data is written. In response to this, the flash memory 1 reads the data from the memory transistors of that address, and outputs it from the data port 5. The write controller 11 has the read data memory 9 store the data through the tester side data port 7. Afterward, it carries out verify check by comparing for each address the data stored in the write data memory 8 with the data stored in the read data memory 9. When all the memory transistors store the data correctly, it completes the data write, whereas if any error is detected in any transistor, the data write and the verify check are repeated. If a particular number of times of rewriting cannot achieve correct writing, a decision is made that the flash memory 1 is defective.

With such an arrangement, the conventional involatile memory has a problem in that the data write time is basically determined by the bus width of the data port 5, and hence it takes a long total time for a today's large capacity memory to achieve the data write. This is because when writing data from the tester 2 to the flash memory 1, or when carrying out the verify check of the data in the flash memory 1, the data must be divided into parts matching the width of the data port 5 to be transferred through it.

SUMMARY OF THE INVENTION

The present invention is implemented to solve the foregoing problem. It is therefore an object of the present invention to provide an involatile memory capable of reducing the write time, and a semiconductor device comprising it.

According to a first aspect of the present invention, there is provided an involatile memory comprising: P memory cell sub-arrays, each of which includes M×N memory transistors, where P, M and N are each an integer equal to or greater than one; P sets of bit lines, each of the P sets including M bit lines each of which is directly connected to N memory transistors of the M×N memory transistors; P decoders, each of which is connected to the M bit lines of one of the P sets of bit lines, for selecting one of the M bit lines in response to an address signal; P I/O drivers, each of which connects the bit line selected by each of the P decoders to an external bus line; sense amplifiers for detecting, between the memory cell sub-arrays and the decoders, outputs of the memory transistors, and for generating logic level signals in response to the outputs; verify check circuits, connected to outputs of the sense amplifiers, respectively, for detecting levels of data in the memory transistors in response to the outputs of the sense amplifiers; and a completion decision circuit that receives check results of the verify check circuits, and produces a verify completion signal when the entire received check results are correct.

According to a second aspect of the present invention, there is provided a semiconductor device comprising: P memory cell sub-arrays, each of which includes M×N memory transistors, where P, M and N are each an integer equal to or greater than one; P sets of bit lines, each of the P sets including M bit lines each of which is directly connected to N memory transistors of the M×N memory transistors; P decoders, each of which is connected to the M bit lines of one of the P sets of bit lines, for selecting one of the M bit lines in response to an address signal; P I/O drivers, each of which connects the bit line selected by each of the P decoders to an internal bus line in the semiconductor device; sense amplifiers for detecting, between the memory cell sub-arrays and the decoders, outputs of the memory transistors, and for generating logic level signals in response to the outputs; verify check circuits, connected to outputs of the sense amplifiers, respectively, for detecting levels of data in the memory transistors in response to the outputs of the sense amplifiers; and a completion decision circuit that receives check results of the verify check circuits, and produces a verify completion signal when the entire received check results are correct.

Here, each of the P decoders may comprise: a plurality of first decoders, each of which is connected to multiple bit lines of the M bit lines, for selecting one of the multiple bit lines in response to the address signal; and a second decoder for selecting one of outputs of the plurality of first decoders in response to the address signal, wherein the sense amplifiers are connected between the plurality of first decoders and the second decoder.

The completion decision circuit may comprise a plurality of completion decision sub-circuits, each of which are provided for every 8 bits or 16 bits of I/O ports of the P I/O drivers.

DETAILED DESCRIPTION OF THE PREFERRED EMBODIMENTS

The invention will now be described with reference to the accompanying drawings.

EMBODIMENT 1

Figure 1:
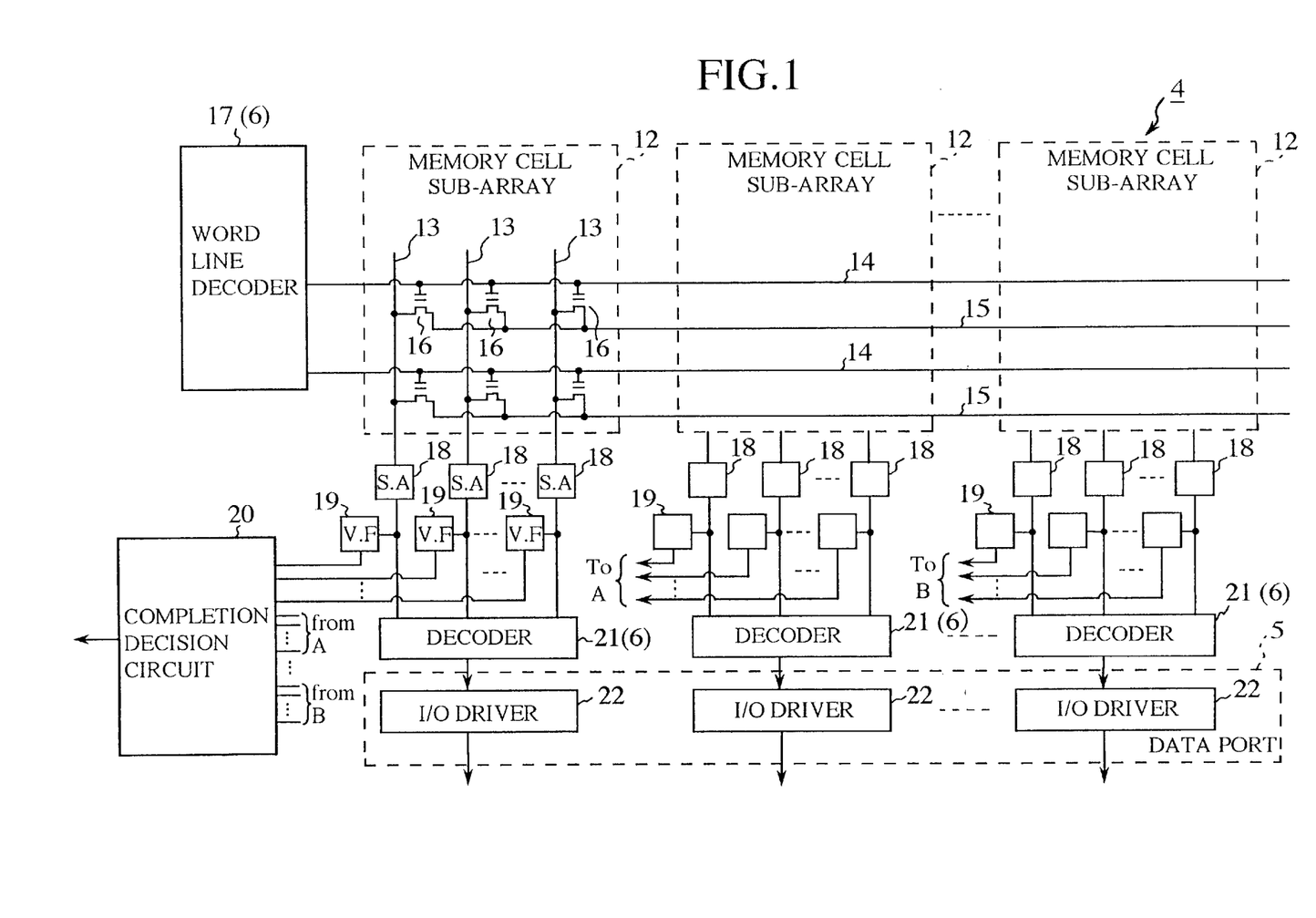
FIG. 1 is a block diagram showing an embodiment 1 of a flash memory in accordance with the present embodiment.

FIG. 1 is a block diagram showing an embodiment 1 of a flash memory in accordance with the present embodiment. In FIG. 1, the reference numeral 5 designates a data port connected to an external data bus; and reference numerals 22s each designate an I/O driver connected to one of the bus lines of the external data bus. The total number of the I/O drivers 22 are P, where P is an integer equal to or greater than one. Reference numerals 16s each designate a memory transistor; 12s each designate a memory cell sub-array consisting of M×N memory transistors 16 corresponding to each I/O driver 22, where M and N are each an integer equal to or greater than one; and 13s each designate a bit line, where each memory cell sub-array 12 includes M bit lines 13. Reference numerals 21s each designates a decoder provided for each memory cell sub-array 12 for selecting one of the M bit lines 13 to be connected to the I/O driver 22. The reference numeral 17 designates a word line decoder for selecting the memory transistors 16 to be connected to the bit line 13 in response to the address input to the flash memory 1; reference numerals 14s each designate a word line the word line decoder 17 uses when selecting the memory transistors 16; and 15s each designate a source line connected to the memory transistors 16.

Reference numerals 18s each designate a sense amplifier that is provided for each bit line 13 between the memory cell sub-array 12 and decoder 21, detects the output of the memory transistor 16 connected to the bit line 13, and generates a logic level signal in response to the output. Reference numerals 19s each designate a verify circuit for checking the logic level of the bit line 13 between the sense amplifier 18 and memory cell sub-array 12. The reference numeral 20 designates a completion decision circuit that receives the check results of all the verify circuits 19, and generates a verify completion signal when the entire check results are correct.

Figure 2:
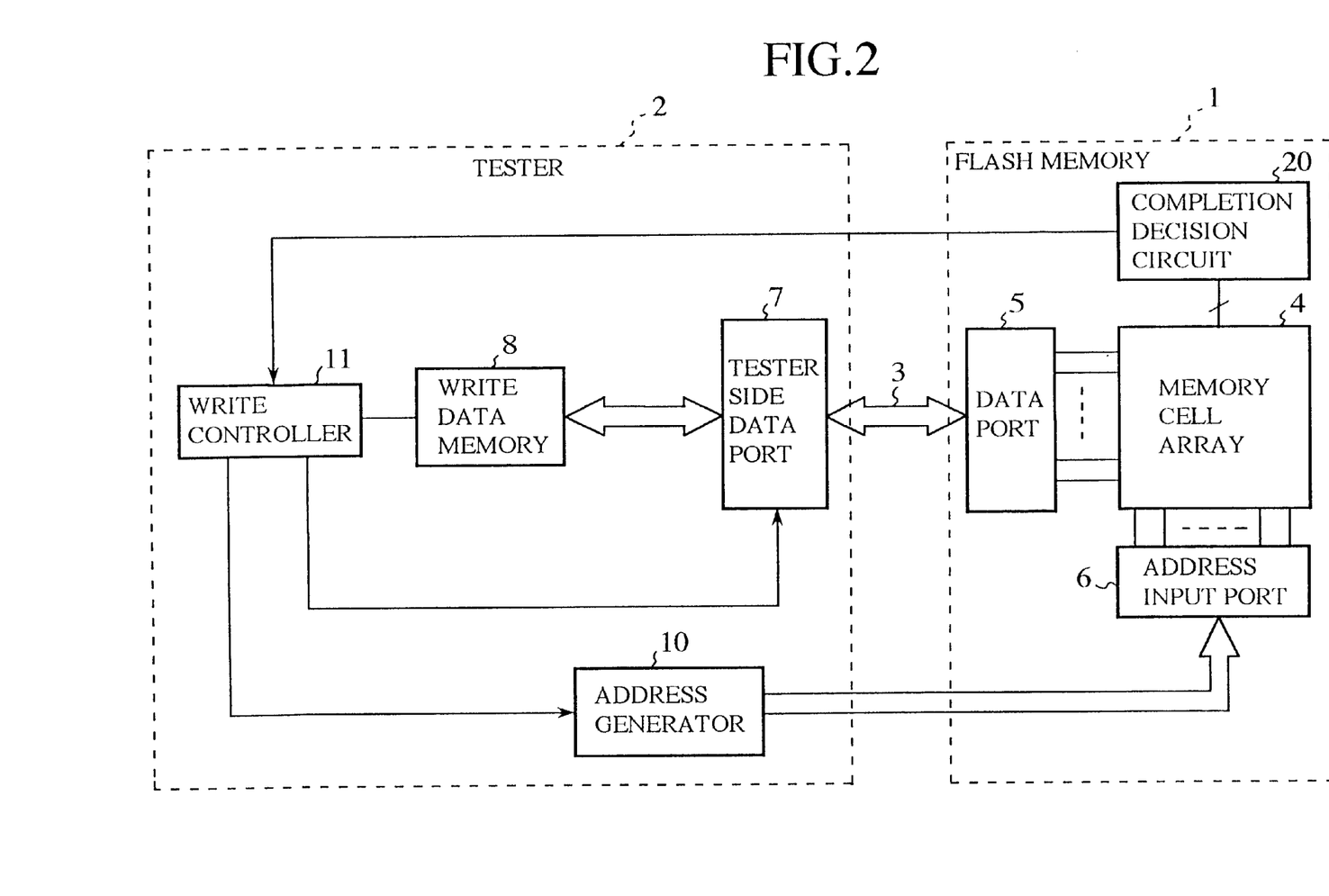
FIG. 2 is a block diagram showing the embodiment 1 of the flash memory in connection with a configuration for writing data into it.

FIG. 2 is a block diagram showing the flash memory of the embodiment 1 in connection with a configuration for writing data into it. In FIG. 2, the reference numeral 1 designates a flash memory; 2 designates a tester for writing data into the flash memory 1; and 3 designates an external data bus (external bus line) for interconnecting them. The reference numeral 4 designates a memory cell array comprising a plurality of memory cell sub-arrays 12 and others; 5 designates a data port for interconnecting the memory cell array 4 with the external data bus 3; and 6 designates an address input port that includes the decoders 21 and the word line decoder 17, and selects the memory transistors corresponding to the address input. The reference numeral 7 designates a tester side data port connected to the external data bus 3; 8 designates a write data memory for storing write data to be output from the tester side data port 7; 10 designates an address generator for generating a data write/read address; and 11 designates a write controller that receives the verify completion signal from the completion decision circuit 20, and controls the blocks 7, 8 and 10 to write into the memory cell array 4 the data in the write data memory 8.

Next, the data write operation into the flash memory 1 will be described.

The data write operation is roughly divided into a memory erase process, erase verify check process, data write process and write data verify check process. If an error address is detected in each verify check process, erase and write processes are repeated. If a predetermined number of erase and write processes cannot achieve the correct data write, a decision is made that the memory is defective, thereby completing the processing. The individual processes will now be described.

In the memory erase process, the flash memory 1 erases the contents of the memory cell array 4 when the write controller 11 in the tester 2 outputs a data erase command. More specifically, a positive voltage is applied to one of the word lines 14 connected to the word line decoder 17, and a negative voltage is applied to the substrate (well) of the memory cell array 4 or to the source lines 15. This generates a potential difference across the word line 14 and the substrate or source lines 15, causing electrons due to the tunnel phenomenon to be injected into the floating gates of the memory transistors 16. Repeating this operation for each word line 14 can achieve the erasure of the memory data.

In the erase verify check process, the data stored in the entire memory transistors 16 connected to each word line 14 are checked. If no error occurs in this process, the entire sense amplifiers 18 connected to the bit lines 13 output. high level signals, in which case the verify circuits 19 also output high level signals. Receiving the high level signals from the entire verify circuits 19, the completion decision circuit 20 stores them, and outputs the verify completion signal of a low level in response to the request from the write controller 11.

If the erase verify result is normal, the write controller 11 moves to the data write process. On the contrary, if it is abnormal, the write controller 11 repeats the erase process and erase verify check process by a predetermined number of times. If the normal result cannot be obtained even after the repetition, the write controller 11 halts the write operation, thereby ending it.

In the data write process, each memory transistor 16 to be written is placed at a low level. More specifically, a negative voltage is applied to the word line 14, and a positive voltage is applied to the bit line 13 connected to the memory transistor 16 to be written. This causes the electrons which have been injected in the floating gate to be removed owing to the tunnel phenomenon. The data write operation is carried out by repeating this operation for each memory transistor 16 to be written.

In the write verify check process, the data stored in the entire written memory transistors 16 connected to each word line 14 are checked. If no error occurs in this process, the entire sense amplifiers 18 connected to the bit lines 13 output low level signals, in which case the verify circuits 19 output high level signals. Receiving the high level signals from the entire verify circuits 19, the completion decision circuit 20 stores them, and outputs the verify completion signal of the low level in response to the request from the write controller 11.

In contrast with this, if any error occurs in the write process, the sense amplifier 18 connected to the bit line 13 having the error outputs a low level signal, in which case the corresponding verify circuit 19 outputs a low level signal. Storing the low level signals from the verify circuit 19, the completion decision circuit 20 outputs the verify completion signal of the high level in response to the request from the write controller 11.

If the write verify result is normal, the write controller 11 completes the data write. On the contrary, if it is abnormal, the write controller 11 repeats the write process and write verify check process by a predetermined number of times. If the normal result cannot be obtained even after the repetition, the write controller 11 halts the write operation, thereby ending it.

Thus, the present embodiment 1 is arranged such that each bit line 13 is provided with the sense amplifier 18 and verify circuit 19, and the verify check results of the individual bit lines 13 detected by them are summarized by the completion decision circuit 20. This enables the flash memory 1 to carry out the verify check on a basis greater than the bus width of the external data bus 3 connected to the flash memory 1, and to supply the tester 2 with the verify check result.

Accordingly, as compared with the conventional system which carries out the verify check in the tester 2 by reading the data through the external data bus 3, the time required for the verify check is reduced. This makes it possible to shorten the total time for the data write operation because the verify check time involved in it is reduced.

EMBODIMENT 2

Figure 3:
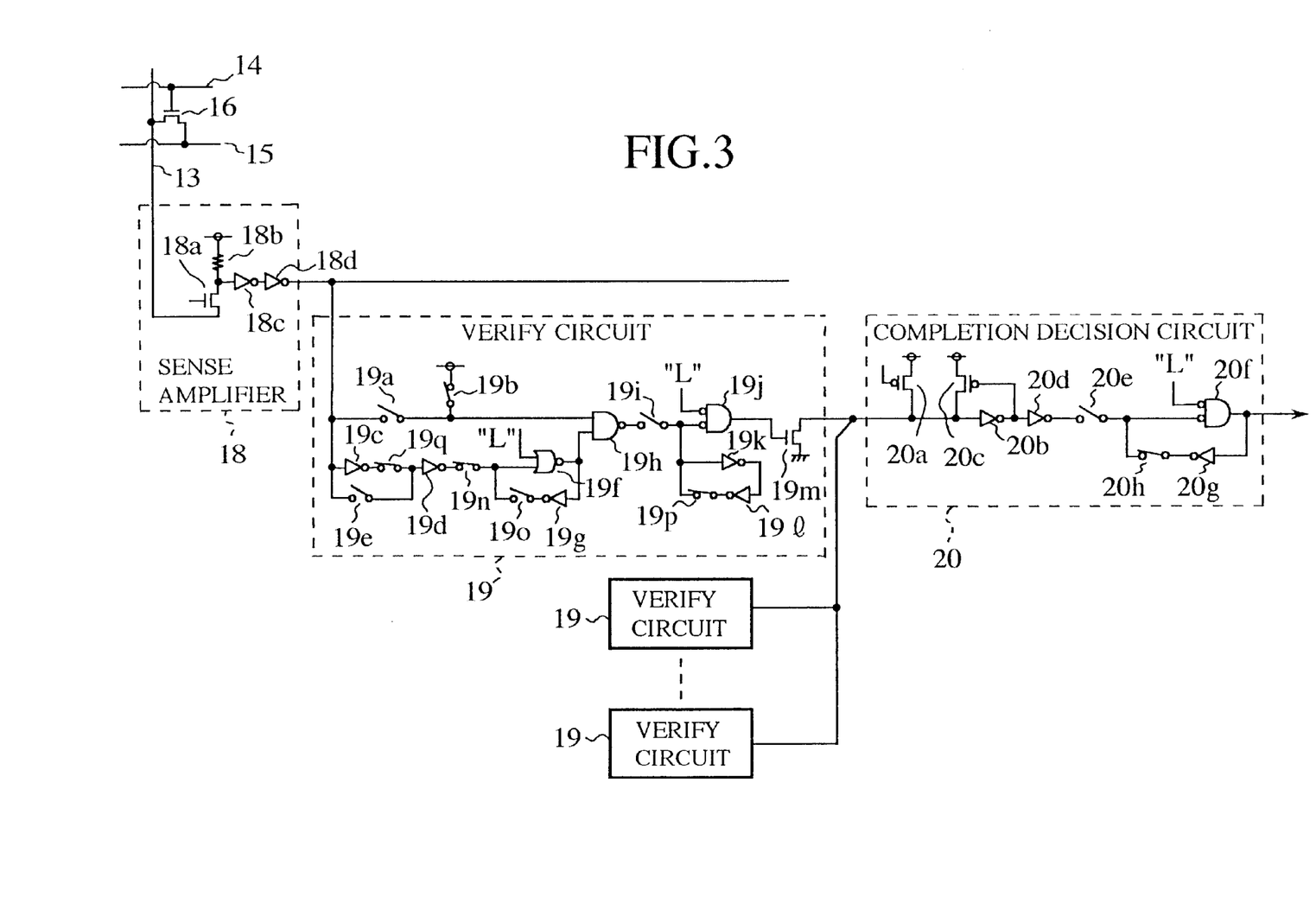
FIG. 3 is a circuit diagram showing a configuration from a bit line 13 to a completion decision circuit 20 in an embodiment 2 of the flash memory in accordance with the present invention.

FIG. 3 is a circuit diagram showing a configuration from the bit line 13 to the completion decision circuit 20 in an embodiment 2 of the flash memory in accordance with the present invention. In FIG. 3, the reference numeral 18a designates a select transistor having its source connected to the bit line 13 and its gate supplied with a high level select signal when data is read through the bit line 13; 18b designates a sense amplifier pullup resistor connected between the drain of the select transistor 18a and a high potential power supply; and 18c and 18d each designate an inverter for amplifying the drain voltage to be output.

Reference numerals 19a and 19e each designate a verify switch which is open during the erase verify check process and is closed during the write verify check; 19b and 19q each designate a verify switch that is closed during the erase verify check process and is open during the write verify check; 19c and 19d each designate an inverter for inverting the output level of the sense amplifier 18; 19f designates an input latch NOR gate for inverting the output of the inverter 19d; and 19g designates an input latch inverter for feeding back the output of the input latch NOR gate 19f to its input. Reference numerals 19n and 19o each designate a switch for controlling the input to a latch circuit consisting of the input latch NOR gate 19f and input latch inverter 19g in such a manner that when the switch 19n is open, the switch 19o is closed, thereby maintaining the current state, whereas when the switch 19n is closed, the switch 19o is open, thereby placing the latch circuit in a transition state. The reference numeral 19h designates a verify NAND gate supplied with the output of the verify switch 19a and the output of the input latch NOR gate 19f; 19i designates a third switch closed at a verify check timing; and 19j designate a verify inverted input AND gate having its first input supplied with the output of the third switch 19i. Reference numerals 19k and 19l designate verify inverters that are connected in antiparallel, and connected to the output of the third switch 19i. The reference numeral 19p designates a switch that is closed when the third switch 19i is open to hold the current state; and 19m designates an output transistor that outputs a low level signal when the verify inverted input AND gate 19j outputs a high level signal.

The reference numeral 20b designates a decision circuit input inverter to which the output signals of the plurality of the verify circuits 19 are input in a wired OR fashion; 20c designates a feedback transistor for carrying out switching in response to the output of the decision circuit input inverter 20b; and 20a designates a decision reset transistor for resetting the input of the decision circuit input inverter 20b to the high level. The reference numeral 20d designates a decision circuit second inverter for inverting the output of the decision circuit input inverter 20b; 20f designates an inverted input AND gate that inverts the output of the decision circuit second inverter 20d; and 20g designates a decision circuit feedback inverter that feeds back the output of the inverted input AND gate 20f to its input. Reference numerals 20e and 20h each designates a switch that controls the input to the latch circuit of the decision circuit consisting of the inverted input AND gate 20f and decision circuit feedback inverter 20g, in which when the switch 20e is open, the switch 20h is closed, thereby holding the current state. Since the remaining portion is the same as that of the embodiment 1, the description thereof is omitted by designating the corresponding portions by the same reference numerals.

Next, the operation of the present embodiment 2 will be described.

In the erase verify check process, a high level signal appears on the bit line 13 if the check result of the data stored in the memory transistor 16 is normal. Accordingly, when the select transistor 18a is supplied with the high level select signal, the sense amplifier 18 outputs a high level signal. Since the two verify switches 19a and 19e of the verify circuit 19 are open in this process, the input latch NOR gate 19f outputs a low level signal. Receiving the low level signal from the input latch NOR gate 19f and a high level signal supplied through the verify switch 19b in the closed state, the verify NAND gate 19h outputs a high level signal. The verify inverted input AND gate 19j outputs a low level signal, when it is supplied with the high level signal from the verify NAND gate 19h at an appropriate timing, thereby placing the output transistor 19m in a high impedance state. Thus, the high level state at the input of the decision circuit input inverter 20b, which the decision reset transistor 20a has set before starting the present erase verify check process, is maintained, and the decision circuit second inverter 20d outputs a high level signal. As a result, the inverted input AND gate 20f outputs the verify completion signal of the low level.

Reversely, if at least one of the bit lines 13, which are subjected to the decision made by the completion decision circuit 20, produces a low level signal, the sense amplifier 18 and verify NAND gate 19h each output a low level signal, and hence the verify inverted input AND gate 19j outputs a high level signal, thereby bringing at least one of the output transistors 19m into conduction. As a result, the input of the decision circuit input inverter 20b is placed at a low level, and hence the verify inverted input AND gate 20f outputs the verify completion signal of the high level.

In the write verify check process, a low level signal appears on the bit line 13 if the check result of the data stored in the memory transistor 16 is normal. Accordingly, when the select transistor 18a is supplied with the high level select signal, the sense amplifier 18 outputs a low level signal. Since the two verify switches 19a and 19e of the verify circuit 19 are closed in this process, the input latch NOR gate 19f outputs a low level signal. Receiving the low level signal from the input latch NOR gate 19f and the low level signal from the sense amplifier 18, the verify NAND gate 19h outputs a high level signal. When supplied with the high level signal from the verify NAND gate 19h at an appropriate timing, the verify inverted input AND gate 19j outputs a low level signal, thereby placing the output transistor 19m in the high impedance state. Thus, the high level state at the input of the decision circuit input inverter 20b, which the decision reset transistor 20a has set before starting the present write verify check process, is maintained, and the decision circuit input inverter 20b outputs a low level signal. As a result, the inverted input AND gate 20f outputs the verify completion signal of the low level.

Reversely, if at least one of the bit lines 13, which are subjected to the decision by the completion decision circuit 20, produces a high level signal, the sense amplifier 18 also outputs a high level signal and the verify NAND gate 19h outputs the low level signal, and hence the verify inverted input AND gate 19j outputs a high level signal, thereby bringing at least one of the output transistors 19m into conduction. As a result, the decision circuit input inverter 20b produces a high level signal, and hence the verify inverted input AND gate 20f outputs the verify completion signal of the high level.

Thus, according to the present embodiment 2, since the plurality of the verify circuits 19, each of which produces a low level signal when an error occurs, are connected to the completion decision circuit 20 in the wired OR fashion, the completion decision circuit 20 produces the verify completion signal of the high level if at least one of the verify check results on the bit lines 13 indicates an error. Thus, the present embodiment 2 can achieve the same effect and advantages as those of the embodiment 1.

EMBODIMENT 3

Figure 4:
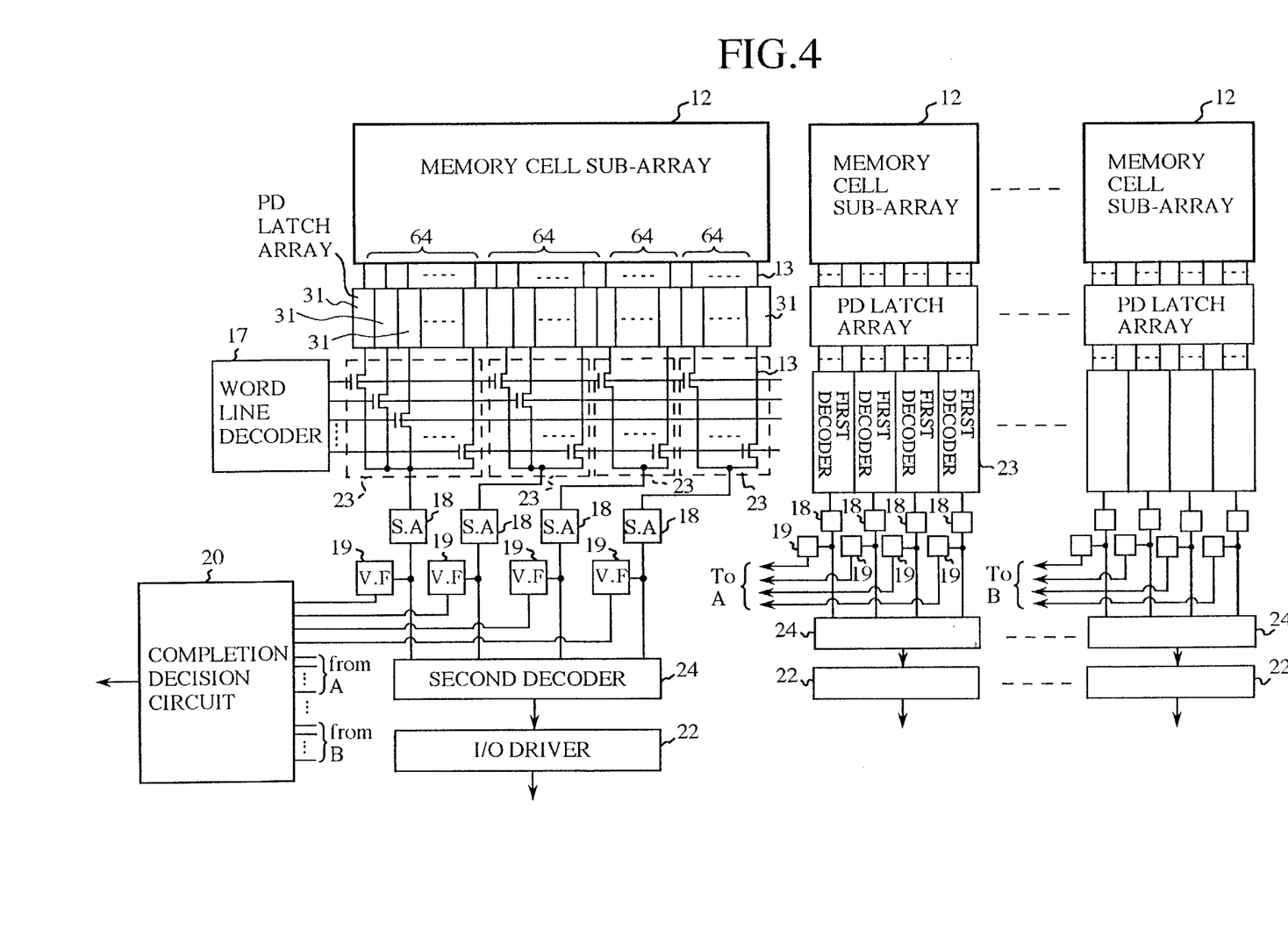
FIG. 4 is a block diagram showing an embodiment 3 of the flash memory in accordance with the present embodiment.

FIG. 4 is a block diagram showing an embodiment 3 of the flash memory in accordance with the present invention. In FIG. 4, reference numerals 23s each designate a first decoder connected with a plurality of bit lines 13 for selecting one of them; and 24s each designate a second decoder connected with the outputs of a plurality of first decoders 23 for selecting one of them. The sense amplifiers 18 are provided in one-to-one correspondence with the first decoders 23, and connected between the first decoders 23 and the second decoder 24. Reference numerals 31s each designate a page data latch that is provided for each bit line 13, and stores data to be written to the bit line 13. Since the remaining portion is the same as that of the embodiment 2, description thereof will be omitted by designating the like portions by the same reference numerals.

Next, the operation of the present embodiment 3 will be described.

In the data write process, the data is continuously and sequentially written into the page data latches 31 through the I/O driver 22. After the data has been written into the entire page data latches 31, one of the word lines 14 is selected, and the data is written into the entire memory transistors 16 connected with the word line 14. Since the remaining operation is the same at that of the embodiment 1, description thereof is omitted here.

According to the present embodiment 3, since the entire data associated with the bit lines 13 is simultaneously written into the entire memory transistors 16 connected with the selected word line 14, after it has once been continuously and sequentially written into the page data latches 31, the synchronization control operation involved in the data write can be simplified as compared with the case which establish synchronization every time the data is supplied through the external data bus 3, thereby reducing the write time. Therefore, the data write process can be completed in a shorter time than in the embodiment 1, reducing the total time required for the data write.

In addition, the present embodiment 3 comprises the plurality of first decoders 23, each of which is connected with the bit lines 13 and selects one of them in accordance with address information, and the second decoder 24 which is supplied with the outputs of the first decoders 23 and selects one of them in accordance with the address information, and has the sense amplifiers 18 connected between the first decoders 23 and second decoder 24. This enables the number of the sense amplifiers 18 to be reduced, and the verify check to be achieved more efficiently on a block by block basis larger than that in the conventional system.

EMBODIMENT 4

Figure 5:
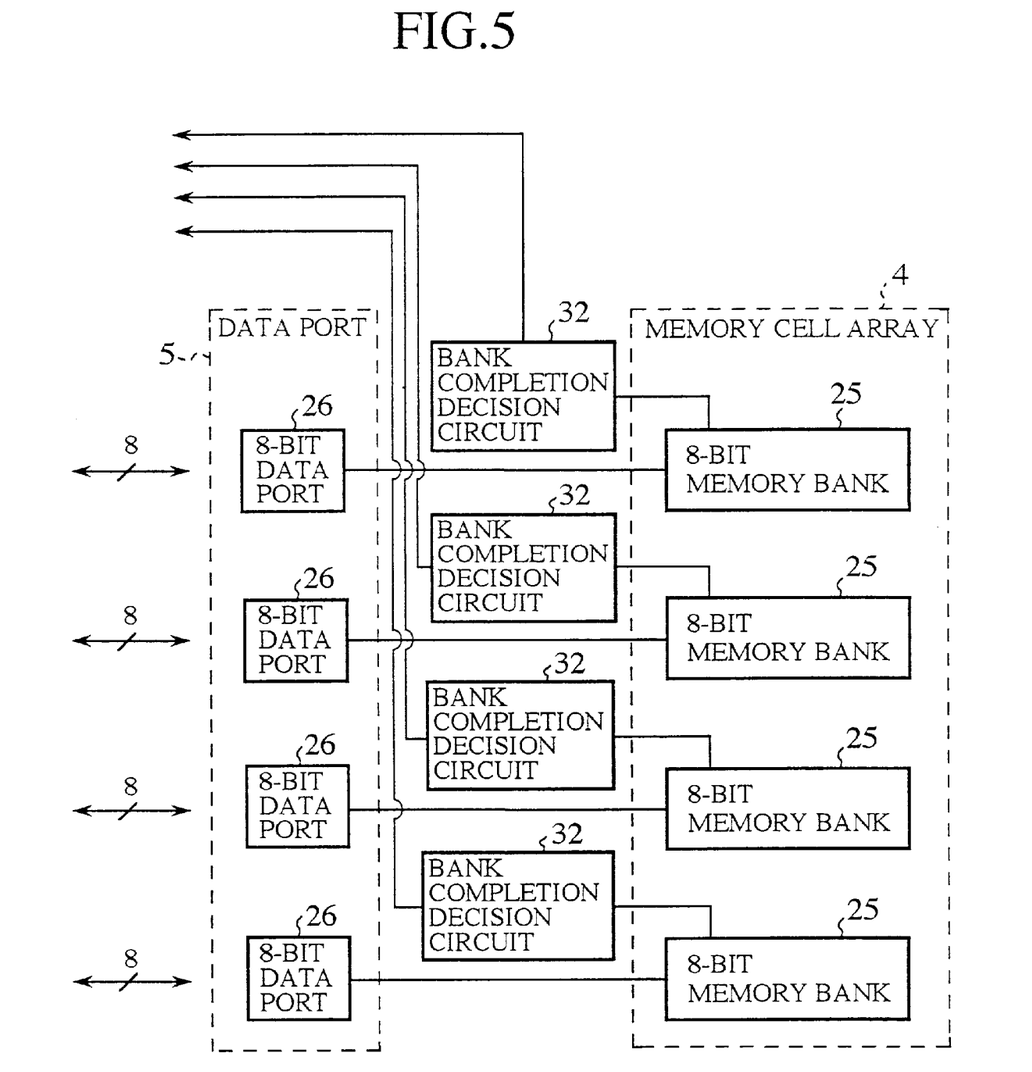
FIG. 5 is a block diagram showing a main portion of an embodiment 4 of the flash memory in accordance with the present embodiment.

FIG. 5 is a block diagram showing an embodiment 4 of the flash memory in accordance with the present invention. The present embodiment 4 can implement, by using an existing 8-bit tester, efficient verify check of the flash memory 1 interconnected with an external bus with a width of more than eight bits. In FIG. 5, reference numerals 25s each designate an 8-bit memory bank consisting of the memory cell sub-array 12 including 8-bit memory cells; 26s each designate an 8-bit data port consisting of the I/O driver 22 for eight bits; and 32s each designate a bank completion decision circuit provided for each 8-bit memory bank 25. Since the details of the structure of individual blocks is the same as that of the embodiment 1, the description thereof is omitted here.

Next, the operation of the present embodiment 4 will be described.

First, an existing 8-bit tester 2 is connected to the first 8-bit data port 26 so that data is written into the first 8-bit memory bank 25 corresponding to the first 8-bit data port 26. If no defective address is found in the first 8-bit memory bank 25, the tester 2 is connected to the second 8-bit data port 26 so that the data is written into the second 8-bit memory bank 25 corresponding to the second 8-bit data port 26. Repeating such operation, verify check can be achieved efficiently of the flash memory 1 through the external bus with a width of more than eight bits.

Thus, since the embodiment 4 is provided with the completion decision circuits 20 for every 8 bits of the I/O drivers 22, even if the bus width of the external data bus 3 is equal to or greater than 32 bits, it can achieve the data write and verify check using the existing 8-bit tester. It is obvious that the same effect can be obtained by providing the completion decision circuit 20 on every 16-bit basis.

EMBODIMENT 5

Figure 6:
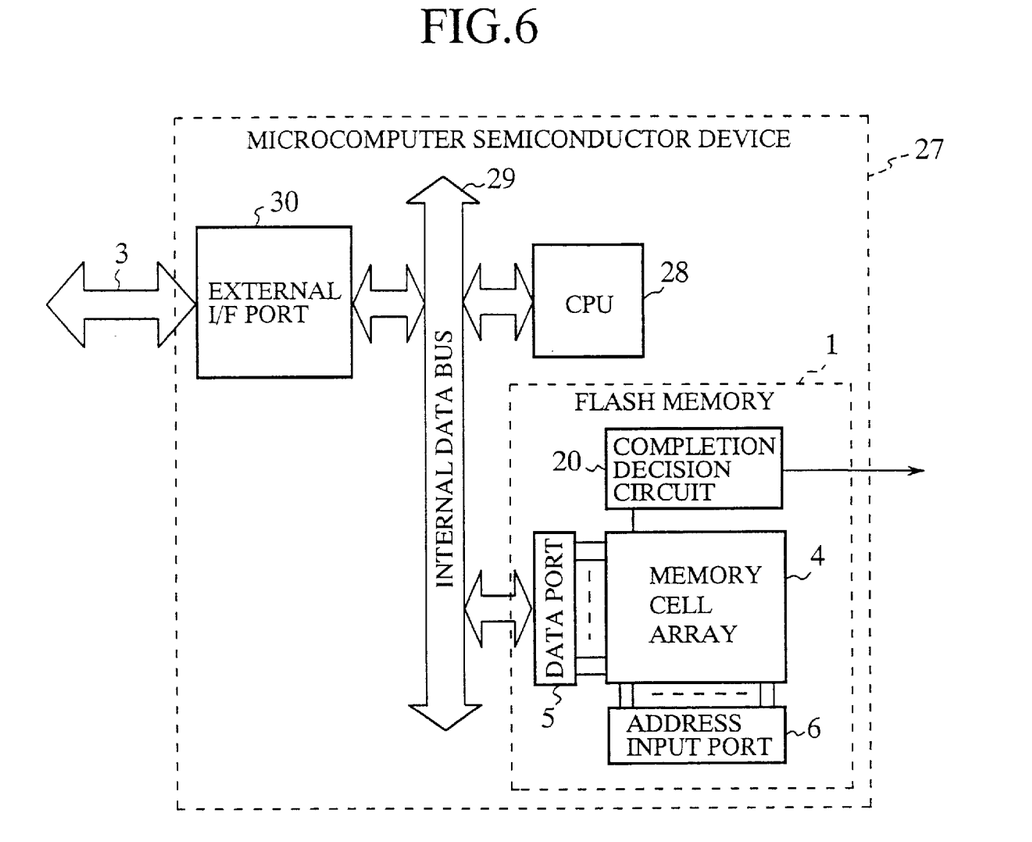
FIG. 6 is a block diagram showing an embodiment 5 of a microcomputer semiconductor device including the flash memory in accordance with the present embodiment.

FIG. 6 is a block diagram showing a microcomputer semiconductor device comprising the flash memory of an embodiment 5 in accordance with the present invention. In FIG. 6, the reference numeral 27 designates a microcomputer semiconductor device; 28 designates a CPU; 30 designates an external I/F port for exchanging data with the external data bus 3 in a predetermined bus width; 29 designates an internal data bus for interconnecting them through a bus width of twice or more the bus width of the external data bus 3; and 1 designates the flash memory with its I/O driver 22 connected to the internal data bus 29. Since the internal configuration of the flash memory 1 is the same as that of the embodiment 1, the description thereof is omitted here.

Next, the operation of the present embodiment 5 will be described.

In the data write process, the semiconductor device writes data every time the data is supplied through the external data bus 3, that is, on the basis of a bus width of the external data bus 3. In the write verify check process, it verifies the written data every time an amount of the data equal to or greater than one bus width of the internal data bus 29 is written. Since the other operation is the same as that of the embodiment 1, the description thereof is omitted here.

Thus, the present embodiment 5, like the embodiment 1, enables the flash memory 1 to carry out the verify check on a basis greater than the bus width of the internal data bus 29, and to supply the tester 2 with the verify check result. Accordingly, as compared with the conventional system which carries out the verify check in the tester 2 by reading the data through the external data bus 3, the time required for the verify check can be reduced. This makes it possible to reduce the total time for the data write operation because the verify check time involved in it is shortened.

EMBODIMENT 6

An embodiment 6 of the microcomputer semiconductor device with a flash memory in accordance with the present invention is the same as the embodiment 5 except that it employs the flash memory as shown in FIG. 4, and hence the description thereof is omitted here.

According to the present embodiment 6, as the embodiment 3 to the embodiment 1, since the write data on the entire bit lines 13 in the data write process has once been successively written, and then is simultaneously written into the entire memory transistors 16 connected with the selected word line 14, the synchronization control operation involved in the data write can be simplified, thereby enabling the write time to be reduced. Therefore, the total time required for the data write can be reduced.

In addition, the present embodiment 3 enables the number of the sense amplifiers 18 to be reduced, and the verify check to be achieved more efficiently on a block by block basis larger than that in the conventional system.

EMBODIMENT 7

An embodiment 7 of the microcomputer semiconductor device with a flash memory in accordance with the present invention is the same as the embodiment 5 except that it employs the flash memory as shown in FIG. 5, and hence the description thereof is omitted here.

Thus, since the embodiment 7, as the embodiment 4 to the embodiment 1, is provided with the completion decision circuits 20 for every 8 bits of the I/O drivers 22, even if the bus width of the internal data bus 29 is equal to or greater than 32 bits, it can achieve the data write and verify check using the existing 8-bit tester. It is obvious that the same effect can be obtained by providing the completion decision circuit 20 on every 16-bit basis.

What is claimed is:

1. An involatile memory comprising:

P memory cell sub-arrays, each of which includes M×N memory transistors, where P, M and N are each an integer equal to or greater than one;

P sets of bit lines, each of said P sets including M bit lines each of which is directly connected to N memory transistors of said M×N memory transistors;

P decoders, each of which is connected to the M bit lines of one of said P sets of bit lines, for selecting one of said M bit lines in response to an address signal;

P I/O drivers, each of which connects the bit line selected by each of said P decoders to an external bus line;

sense amplifiers, coupled between said memory cell sub-arrays and said decoders, for detecting outputs of said memory transistors, and for generating logic level signals in response to said outputs;

verify check circuits, connected to outputs of said sense amplifiers, respectively, for detecting levels of data in said memory transistors in response to the outputs of said sense amplifiers; and a completion decision circuit that receives check results of said verify check circuits, and produces a verify completion signal when the entire received check results are correct.

2. The involatile memory as claimed in claim 1, wherein each of said P decoders comprises:

a plurality of first decoders, each of which is connected to multiple bit lines of said M bit lines, for selecting one of said multiple bit lines in response to the address signal; and a second decoder for selecting one of outputs of said plurality of first decoders in response to the address signal, wherein said sense amplifiers are connected between said plurality of first decoders and said second decoder.

3. The involatile memory as claimed in claim 1, wherein said completion decision circuit comprises a plurality of completion decision sub-circuits, each of which are provided for every 8 bits or 16 bits of I/O ports of said P I/O drivers.

4. A semiconductor device comprising:

P memory cell sub-arrays, each of which includes M×N memory transistors, where P, M and N are each an integer equal to or greater than one;

P sets of bit lines, each of said P sets including M bit lines each of which is directly connected to N memory transistors of said M×N memory transistors;

P decoders, each of which is connected to the M bit lines of one of said P sets of bit lines, for selecting one of said M bit lines in response to an address signal;

P I/O drivers, each of which connects the bit line selected by each of said P decoders to an internal bus line in said semiconductor device;

sense amplifiers, coupled between said memory cell sub-arrays and said decoders, for detecting outputs of said memory transistors, and for generating logic level signals in response to said outputs;

verify check circuits, connected to outputs of said sense amplifiers, respectively, for detecting levels of data in said memory transistors in response to the outputs of said sense amplifiers; and a completion decision circuit that receives check results of said verify check circuits, and produces a verify completion signal when the entire received check results are correct.

5. The semiconductor device as claimed in claim 4, wherein each of said P decoders comprises:

a plurality of first decoders, each of which is connected to multiple bit lines of said M bit lines, for selecting one of said multiple bit lines in response to the address signal; and a second decoder for selecting one of outputs of said plurality of first decoders in response to the address signal, wherein said sense amplifiers are connected between said plurality of first decoders and said second decoder.

6. The semiconductor device as claimed in claim 4, wherein said completion decision circuit comprises a plurality of completion decision sub-circuits, each of which are provided for every 8 bits or 16 bits of I/O ports of said P I/O drivers.

* * * * *